United States Patent
Anderson et al.

(10) Patent No.: US 10,312,347 B2
(45) Date of Patent: *Jun. 4, 2019

(54) SLOPED FINFET WITH METHODS OF FORMING SAME

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/868,274

(22) Filed: Jan. 11, 2018

(65) Prior Publication Data

US 2018/0158924 A1   Jun. 7, 2018

Related U.S. Application Data

(63) Continuation of application No. 14/616,018, filed on Feb. 6, 2015, now Pat. No. 9,985,112.

(51) Int. Cl.
| | |
|---|---|
| *H01L 27/12* | (2006.01) |
| *H01L 21/84* | (2006.01) |
| *H01L 29/417* | (2006.01) |
| *H01L 29/78* | (2006.01) |
| *H01L 29/66* | (2006.01) |

(52) U.S. Cl.
CPC .... *H01L 29/6656* (2013.01); *H01L 29/66545* (2013.01); *H01L 29/66795* (2013.01); *H01L 29/66818* (2013.01); *H01L 29/7853* (2013.01)

(58) Field of Classification Search
CPC ............... H01L 27/1211; H01L 21/845; H01L 29/41791; H01L 29/6656; H01L 29/66545; H01L 29/66795; H01L 29/66818; H01L 29/7853
USPC .......................................... 257/347; 438/586
See application file for complete search history.

(56) References Cited

U.S. PATENT DOCUMENTS

| | | |
|---|---|---|
| 7,141,856 B2 | 11/2006 | Lee et al. |
| 7,355,233 B2 | 4/2008 | Liaw |
| 7,355,253 B2 | 4/2008 | Cohen |
| 8,071,983 B2 | 12/2011 | Brask et al. |
| 8,546,891 B2 | 10/2013 | Chang et al. |
| 9,985,112 B2 | 5/2018 | Anderson et al. |

(Continued)

OTHER PUBLICATIONS

US 8,508,000 B1, 08/2013, Chang et al. (withdrawn)
Chen et al., "A 10 nm Si-based Bulk FinFETs 6T SRAM with Multiple Fin Heights Technology for 25% Better Static Noise Margin," 2013, pp. T218-T219, Symposium on VLSI Technology Digest of Technical Pages.

(Continued)

*Primary Examiner* — Cuong Q Nguyen
*Assistant Examiner* — Tong-Ho Kim
(74) *Attorney, Agent, or Firm* — Steven J. Meyers; Hoffman Warnick LLC

(57) ABSTRACT

Embodiments of the present disclosure provide an integrated circuit (IC) structure, which can include: a semiconductor fin; a gate dielectric positioned above a first region of the semiconductor fin; a spacer positioned above a second region of the semiconductor fin and adjacent to the gate dielectric; and a source/drain region contacting a third region of the semiconductor fin; wherein the first region of the semiconductor fin includes substantially vertical sidewalls, and the third region of the semiconductor fin includes sloped sidewalls.

20 Claims, 7 Drawing Sheets

(56) References Cited

U.S. PATENT DOCUMENTS

| | | | |
|---|---|---|---|
| 2005/0202608 A1* | 9/2005 | Beintner | H01L 29/66818 438/164 |
| 2013/0056827 A1* | 3/2013 | Tsai | H01L 29/785 257/347 |
| 2013/0093026 A1 | 4/2013 | Wann et al. | |
| 2013/0221447 A1 | 8/2013 | Lee et al. | |
| 2014/0042556 A1 | 2/2014 | Chang et al. | |
| 2014/0061734 A1* | 3/2014 | Basker | H01L 29/66795 257/288 |
| 2014/0175554 A1* | 6/2014 | Loubet | H01L 21/823431 257/368 |
| 2014/0264488 A1 | 9/2014 | Fronheiser et al. | |
| 2015/0064854 A1* | 3/2015 | Leobandung | H01L 27/1211 438/157 |
| 2015/0187943 A1 | 7/2015 | Lee et al. | |
| 2018/0138286 A1 | 5/2018 | Anderson et al. | |

OTHER PUBLICATIONS

Anderson, Brent A. et al.; Non Final Office Action dated Jun. 23, 2016 for U.S. Appl. No. 14/616,018, filed Feb. 6, 2015; pp. 23.

Anderson, Brent A. et al.; Final Office Action dated Dec. 20, 2016 for U.S. Appl. No. 14/616,018, filed Feb. 6, 2015; pp. 24.

Anderson, Brent A.; Non Final Office Action dated Apr. 7, 2017 for U.S. Appl. No. 14/616,018, filed Feb. 6, 2015; pp. 25.

Anderson, Brent A.; Final Office Action dated Nov. 3, 2017 for U.S. Appl. No. 14/616,018, filed Feb. 6, 2015; pp. 27.

Non-Final Office Action dated Apr. 6, 2018 for U.S. Appl. No. 15/868,224, filed Jan. 11, 2018; pp. 15.

Notice of Allowance dated Jan. 22, 2018 for U.S. Appl. No. 14/616,018, filed Feb. 6, 2015; pp. 8.

Final Office Action dated Nov. 1, 2018 for U.S. Appl. No. 15/868,224, filed Jan. 11, 2018; pp. 20.

\* cited by examiner

SLOPED FINFET WITH METHODS OF FORMING SAME

BACKGROUND

The disclosure relates generally to structures and manufacturing processes for field effect transistors (FETs). More specifically, embodiments of the present disclosure include a sloped finFET structure, and processes for fabricating the sloped finFET structure.

In integrated circuit (IC) structures, a transistor is a critical component for implementing digital circuitry designs. Generally, a transistor includes three electrical terminals: a source, a drain, and a gate. By applying different voltages to the gate terminal, the flow of electric current between the source and the drain can be turned on and off. A common type of transistor is a metal oxide field effect transistor (MOSFET). One type of MOSFET structure is a "FinFET," typically formed upon a semiconductor-on-insulator (SOI) layer and buried insulator layer. A FinFET can include a semiconductor structure etched into a "fin" shaped body, with one side of the fin acting as a source terminal and the other side of the fin acting as a drain terminal. A gate structure, which may be at least partially conductive, can be formed around one or more of the semiconductor fins. By applying a voltage to the gate structure, an electrically conductive channel can be created between the source and drain terminals of each fin in contact with the gate.

Over time, improvements to the structure and performance of a transistor, in addition to the ever-decreasing size of these components, have presented significant technical and manufacturing challenges. FinFETs in particular present conflicting demands for high yield processes and high-performance FETs. For example, designing the fin structures in a finFET as vertical elements can offer accurate and stable performance during operation. At the same time, these vertical elements can impede some manufacturing processes. For example, vertical sidewalls may impede the forming of source and drain contacts, spacer fabrication, epitaxial growth, and may also create additional electrical resistance during operation.

BRIEF SUMMARY

A first aspect of the disclosure provides an integrated circuit (IC) structure including: a semiconductor fin; a gate dielectric positioned above a first region of the semiconductor fin; a spacer positioned above a second region of the semiconductor fin and adjacent to the gate dielectric; and a source/drain region contacting a third region of the semiconductor fin; wherein the first region of the semiconductor fin includes substantially vertical sidewalls, and the third region of the semiconductor fin includes sloped sidewalls.

A second aspect of the disclosure provides a method of forming an integrated circuit (IC) structure. The method can include: forming a sacrificial gate on a semiconductor fin; forming a first spacer on the semiconductor fin; tapering an exposed portion of the semiconductor fin to form sloped sidewalls thereon; and forming a second spacer at least partially on the exposed portion of the semiconductor fin.

A third aspect of the disclosure provides an integrated circuit (IC) structure. The IC structure can include: a semiconductor fin; a gate dielectric positioned above a channel region of the semiconductor fin, the channel region of the semiconductor fin being positioned between two end regions of the semiconductor fin; a spacer positioned above the two end regions of the semiconductor fin, wherein the spacer is positioned circumferentially about the gate dielectric; a source contact coupled to one of the two end regions of the semiconductor fin; and a drain contact coupled to the other of the two end regions of the semiconductor fin; wherein the channel region of the semiconductor fin includes substantially vertical sidewalls, and the two end regions of the semiconductor fin include sloped sidewalls.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements among the drawings.

DETAILED DESCRIPTION

Embodiments of the present disclosure provide an integrated circuit (IC) structure with features for enhancing both manufacturability and performance. The present disclosure also contemplates methods for fabricating the IC structure described herein. Generally, an IC structure according to the present disclosure can include a finFET with a gate dielectric and spacer(s) formed over a portion (e.g., a central portion) of one or more semiconductor fins positioned on an insulating material. The portions of the semiconductor fin which contact the gate dielectric and/or spacers, and may include at least substantially vertical sidewalls. Other portions of the semiconductor fin(s) can extend beyond the gate dielectric and spacer(s), and may include sloped sidewalls. Source and drain contacts can be formed over and/or in contact with the sloped sidewalls of the semiconductor fin(s) to form an electrical connection to other elements. The sloped sidewalls, among other things, can increase the amount of viable surface area upon which source and drain contacts (or other structures) can be fabricated through epitaxial growth.

Figure 1:
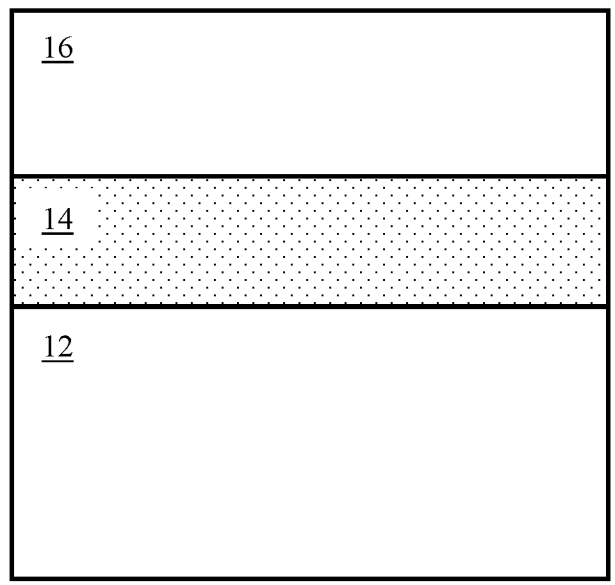
FIG. 1 shows a cross-sectional view of an insulator later positioned between two semiconductor layers in a process according to embodiments of the present disclosure.

Referring to FIG. 1, a process of forming an IC according to aspects of the present disclosure is shown. A substrate 12 can be composed of any currently known or later developed semiconductor material, which may include without limitation: silicon, germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances can include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, the entirety of substrate 12 or a portion thereof may be strained.

A buried insulator layer 14 can be formed on and positioned above substrate 12. Buried insulator layer 14 may be composed of any insulating material such as $SiO_2$ or a dielectric having a high dielectric constant, which may be, for example, above 3.9. In some situations, buried insulator layer 14 may be composed of an oxide substance, and correspondingly may be referred to as a buried oxide (BOX) layer. Materials appropriate for the composition of buried insulator layer 14 may include, for example, silicon dioxide ($SiO_2$), silicon nitride (SiN), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later developed materials having similar properties.

A semiconductor layer 16 can be formed on buried insulator layer 14. One process by which semiconductor layer 16 can be formed on buried insulator layer 14 is wafer bonding. "Wafer bonding" generally can refer to a process in which two semiconductor wafers are bonded together, forming a single substrate material. The bonded semiconductor wafers can be cut using any currently known or later developed semiconductor or SOI fabrication process. As one example, a semiconductor material can be formed by implanting a bonded wafer with hydrogen and then annealing the wafer, causing it to split along the plane of the implanted hydrogen. Semiconductor layer 16 can, together with substrate 12 and buried insulator layer 14, form a semiconductor-on-insulator (SOI) structure. Semiconductor layer 16 can be composed of, for example, silicon or another semiconductor material, and optionally may have the same material composition as substrate 12.

Figure 2:
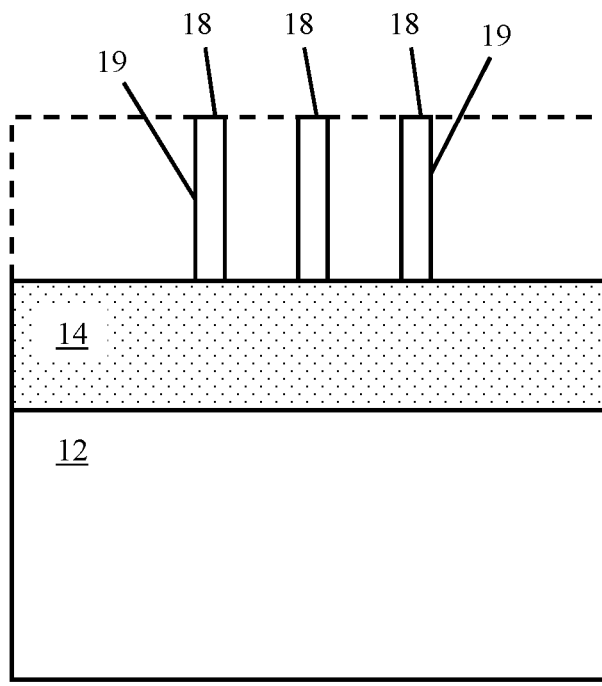
FIG. 2 shows a cross-sectional view of multiple semiconductor fins formed from a semiconductor layer and positioned on an insulator layer in a process according to embodiments of the present disclosure.

Turning to FIG. 2, a view of substrate 12, buried insulator layer 14, and semiconductor layer 16 undergoing a process according to the present disclosure is shown. IC structures according to embodiments of the present disclosure can take the form of a finFET component. A finFET generally refers to a FET design typically built from an SOI substrate, where semiconductor material positioned on a buried insulator layer is etched into one or more fin-shaped structures to act as a channel. A gate component and/or other elements of the resulting finFET can be formed around and over the fin(s), as detailed in other process steps outlined herein. Following the formation of semiconductor layer 16, one or more semiconductor fins 18 can be formed therefrom via any currently known or later developed process of removing a portion of a semiconductor material, e.g., depositing a material and performing a pattern etch. As used herein, the term "depositing" may include any now known or later developed technique appropriate for deposition, including but not limited to, for example: chemical vapor deposition (CVD), low-pressure CVD (LPCVD), plasma-enhanced CVD (PECVD), sub-atmosphere CVD (SACVD) high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. In addition, "removing" as used herein can include any one of various material removal or polishing techniques now known or later developed, e.g., etching, a reactive ion etch (RIE), etc. "RIE" or "reactive ion etch" refers to a variation of plasma etching in which, during etching, a semiconductor wafer is placed on an RF powered electrode. Throughout RIE, the wafer may take on an electric potential which accelerates the etching species extracted from plasma toward the etched surface.

Although three semiconductor fins 18 are shown in FIG. 2 by way of example, a single FinFET structure can include only one semiconductor fin 18, or any desired greater number of semiconductor fins. In alternative embodiments, semiconductor fins 18 can be formed by removing portions of buried insulator layer 14 and forming semiconductive material therein (e.g., by deposition). Although semiconductor fins 18 are shown by example as protruding from buried insulator layer 14, it is understood that embodiments of the present disclosure can be applied to semiconductor fins 18 which extend through buried insulator layer 14 to contact substrate 12. In any event, semiconductor fins 18 can include sidewalls 19 which may be substantially vertical (e.g., oriented at an angle between approximately eighty-seven degrees and approximately ninety-three degrees) from the surface of buried insulator layer 14.

Figure 3:
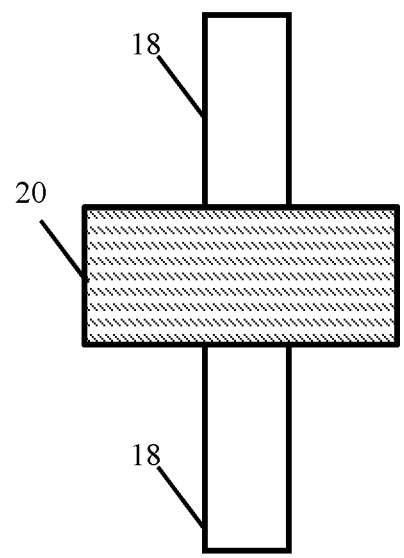
FIGS. 3-4 show top-down views of process steps according to embodiments of the present disclosure.

A top-down view of semiconductor fin 18 undergoing a process according to the present disclosure is provided in FIG. 3. A sacrificial gate 20 can be formed on semiconductor fin 18. Sacrificial gate 20 can be formed by deposition and patterning and/or any other currently known or later developed process of forming an at least partially conductive material or a metal on another component. In an embodiment, sacrificial gate 20 can be in the form of a single or multilayered component including metals or semiconductive materials such as polycrystalline silicon. Sacrificial gate 20 can also be formed on and/or in contact with buried insulator layer 14 (FIGS. 1, 2) in addition to semiconductor fin 18. Buried insulator layer 14 is omitted from FIG. 3 for the purposes of clarity, and it is understood that buried insulator layer 14 can be positioned below semiconductor fin 18 and extend laterally beyond the surface area where semiconductor fin 18 contacts buried insulator layer 14.

Figure 4:
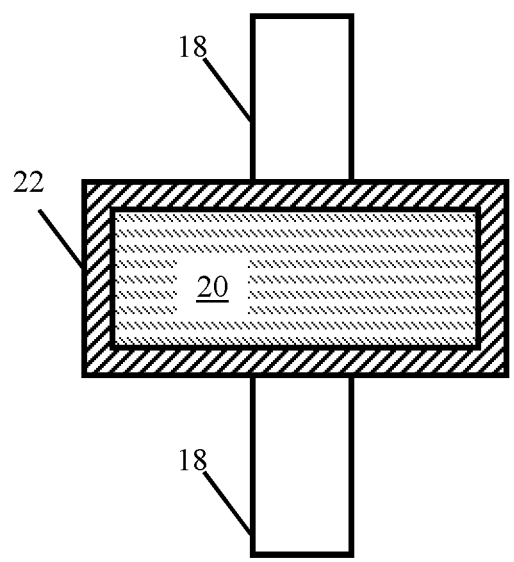

Turning to FIG. 4, another process step according to embodiments of the present disclosure is shown. A first spacer 22 can be formed on semiconductor fin 18. First spacer 22 can be positioned circumferentially about sacrificial gate 20, such that first spacer 22 contacts both sacrificial gate 20 and semiconductor fin 18. First spacer 22 can be formed, e.g., by deposition on buried insulator layer 14 (FIGS. 1, 2), semiconductor fin 18, and sacrificial gate 20. To expose sacrificial gate 20, portions of first spacer 22 can be removed and/or planarized. First spacer 22 can electrically isolate sacrificial gate 20 from other components of an IC structure, e.g., other wires and components laterally separated from sacrificial gate 20. First spacer 22 can also support the structural interface between semiconductor fin(s) 18 and other elements. In some embodiments, first spacer 22 can be formed as a coating on semiconductor fin(s) 18, sacrificial gate 20, and/or other elements. First spacer 22 can be composed of, e.g., an insulating material such as a nitride or an oxide compound, including, for example, one or more of the insulating materials described herein.

Figure 5:
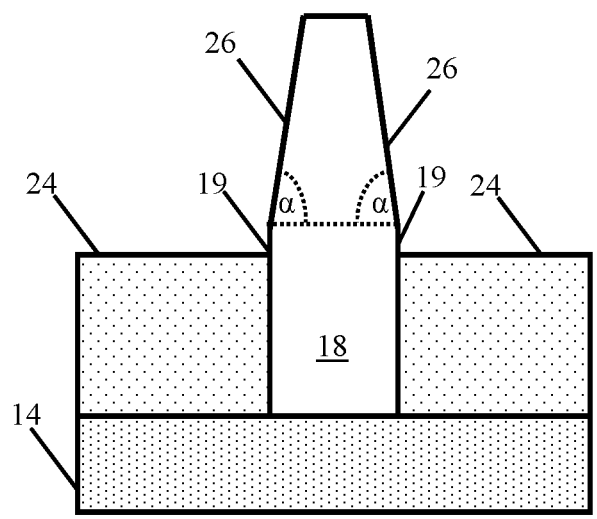
FIG. 5 shows a cross-sectional view of a semiconductor fin with sloped sidewalls according to embodiments of the present disclosure.

Referring to FIG. 5, a process for modifying semiconductor fin(s) 18 is shown. A dielectric 24 can be formed on buried insulator layer 14, e.g., by deposition thereon followed by selective etching and/or removal of dielectric material formed on portions of semiconductor fin(s) 18 and/or other elements discussed herein. Dielectric 24 can contact and/or partially cover sidewalls 19 of semiconductor fin 18, while leaving the remainder of semiconductor fin(s) 18 exposed. Exposed portions of semiconductor fin(s) 18 can be tapered into a sloped shape by any currently known or later developed process for partially removing and/or modifying an IC element, e.g., by partially etching semiconductor fin(s) 18 to form a sloped shape. In an embodiment, the tapering process can be performed by orienting conventional etching and/or other tools for partially removing a semiconductor material at a particular angle.

The process of tapering can form sloped sidewalls 26 on exposed portions of semiconductor fin(s) 18. Sloped sidewalls 26 can be oriented to have a non-perpendicular angle with respect to buried insulator layer 14, and as an example can be oriented at an angle α of between approximately seventy degrees and approximately eighty-seven degrees relative to buried insulator layer 14. As used herein, the term "approximately" in relation to a specified numerical value (including percentages of base numerical values) can include all values within ten percentage points of (i.e., above or below) the specified numerical value or percentage, and/or all other values which cause no operational difference or substantial operational difference between the modified value and the enumerated value. The term approximately can also include other specific values or ranges where specified herein. It is understood that sloped sidewalls 26 of a single semiconductor fin 18 can have varying dimensions and/or angles α throughout a particular surface, and with respect to other sloped sidewalls 26 of a single semiconductor fin 18.

Figure 6:
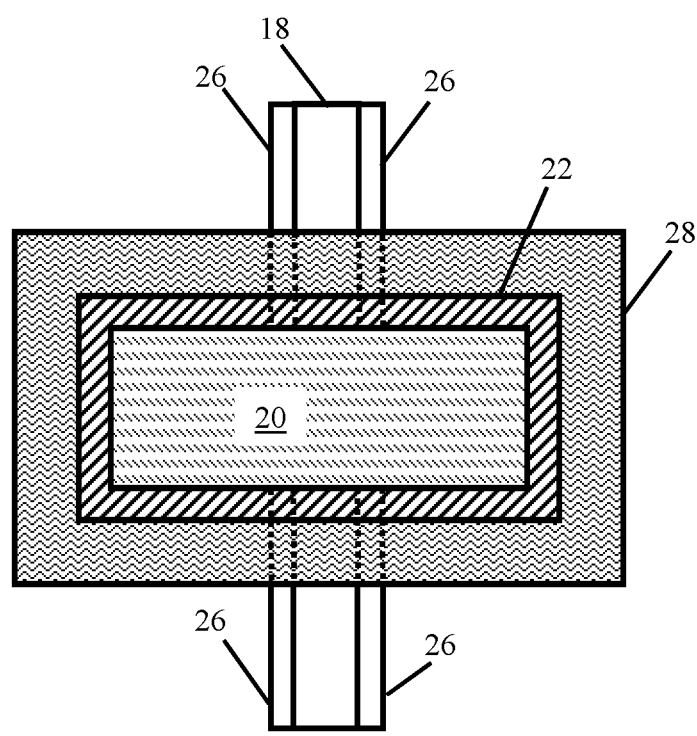
FIGS. 6-7 show top-down views of other process steps according to embodiments of the present disclosure.

Turning to FIG. 6, embodiments of the present disclosure can include forming additional spacer components after the forming of sloped sidewalls 26. A second spacer 28 can be formed at least partially on exposed portions of semiconductor fin(s) 18. In an embodiment, second spacer 28 can be formed on (e.g., by deposition) and positioned in contact with one or more semiconductor fins 18, sacrificial gate 20 and first spacer 22. The formed second spacer 28 can then be modified or partially removed (e.g., by etching and/or planarization), such that the formed second spacer 28 is positioned circumferentially about first spacer 22. Sloped sidewalls 26 may be formed on semiconductor fin(s) 18 before the forming of first and second spacers 22, 28 in some applications. In this case, portions of semiconductor fin(s) 18 positioned below first and second spacers 22, 28 can include sloped sidewalls 26 (shown in phantom). Sloped sidewalls 26 can alternatively be absent from semiconductor fin(s) 18 beneath first spacer 22 or second spacer 28, based on the time at which first and second spacers 22, 28 are formed.

Figure 7:
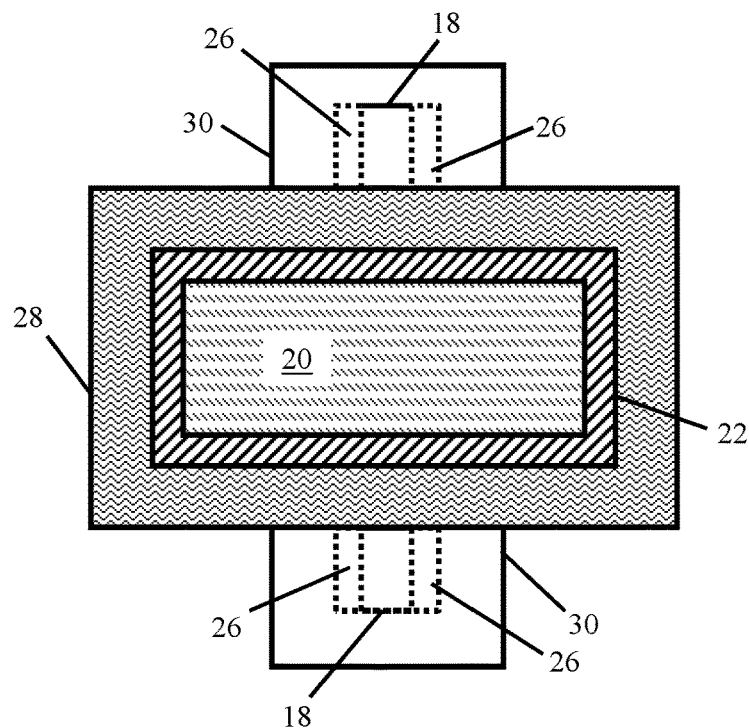

FIG. 7 illustrates a process of forming electrical connections between semiconductor fin(s) 18 and other components. Source/drain contact(s) 30 can be formed on semiconductor fin(s) 18 outside first and second spacer 22, 28, e.g., by epitaxial growth. Epitaxial growth or "epitaxy" can refer to a process in which a thin layer of single-crystal material is deposited on a single-crystal substrate. Epitaxial growth can occur in such a way that the crystallographic structure of the substrate is reproduced in the formed material. Alternative techniques can include depositing source/drain contacts 30 onto semiconductor fin(s) 18. Source/drain contact(s) 30 may be composed of a crystalline conductive or semiconductive material including, e.g., silicon (Si), silicon carbon (SiC), monocrystalline or polycrystalline silicon germanium (SiGe), silicon germanium carbon (SiGeC), Ge alloys, gallium arsenic (GaAs), indium arsenic (InAs), indium phosphorus (InP), other iii-V or ii-VI compound semiconductors, as well as organic conductors or semiconductors.

Figure 8:
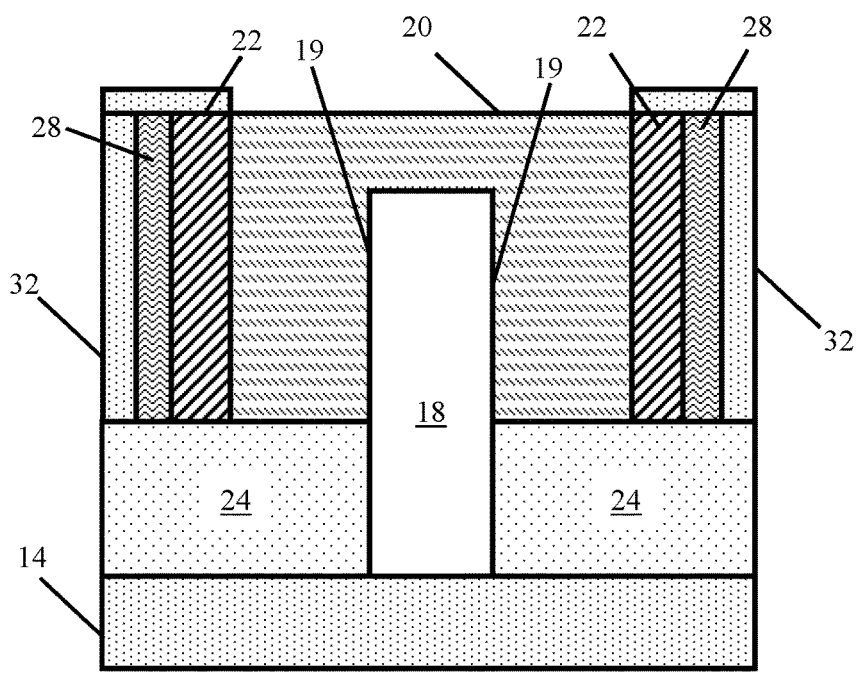
FIGS. 8-10 show cross-sectional views of processes for removing a sacrificial gate and processing a semiconductor fin according to embodiments of the present disclosure.

Turning now to FIG. 8, processes according to the present disclosure can include removing sacrificial gate 20 and replacing sacrificial gate 20 with other types of gate dielectric materials and/or gate stacks. In a transistor such as a finFET, a gate can be a structure for controlling the output current (i.e., the flow of carrier atoms in the channel region of semiconductor fin(s) 18), which may include a dielectric material and/or a stack of various materials. A dielectric layer 32 in the form of one or more insulating materials discussed elsewhere herein, such as a flowable oxide, can be formed (e.g., by deposition) on sacrificial gate 20, first spacer 22, and second spacer 28 to contact and/or cover each of these components. The formed dielectric layer 32 and portions of the components it contacts can then be removed (e.g., by a planarization process) to expose sacrificial gate 20. Semiconductor fin(s) 18 positioned within and/or beneath sacrificial gate 20 can include substantially vertical sidewalls 19 without sloping.

Figure 9:
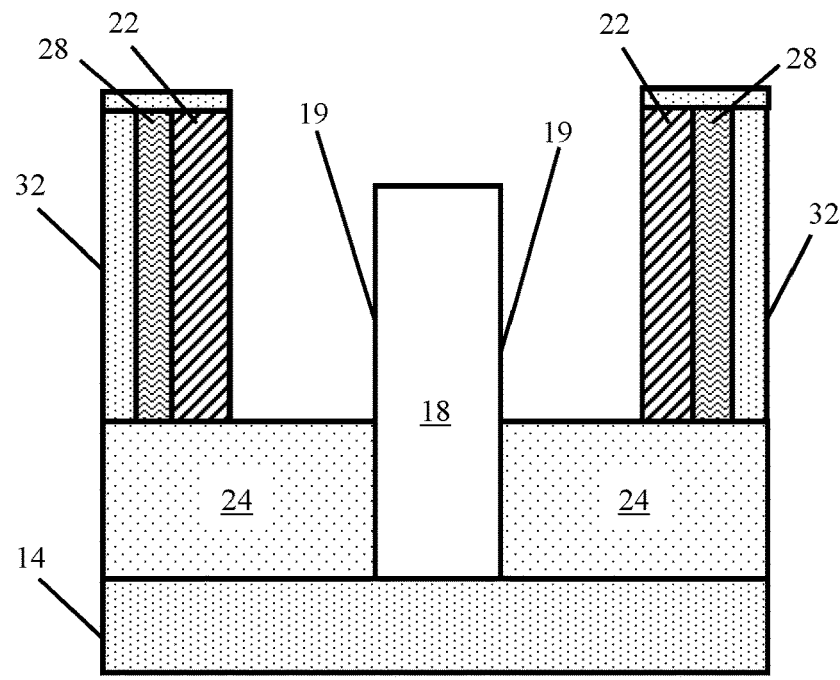

Referring to FIG. 9, sacrificial gate 20 can be removed by, e.g., a selective etching process such as chemical etching. In other embodiments, etch masks (not shown) can be placed on dielectric layer 32 while sacrificial gate 20 remains exposed. Where sacrificial gate 20 is composed of polycrystalline silicon, sacrificial gate 20 can be removed by a particular etching solution (e.g., a hydrogen fluoride-water solution) which removes the crystalline polysilicon of sacrificial gate 20 while not affecting other materials, e.g., first and second spacers 22, 28, dielectric layer 32, etc. Semiconductor fin(s) 18 can be exposed after sacrificial gate 20 is removed.

Figure 10:
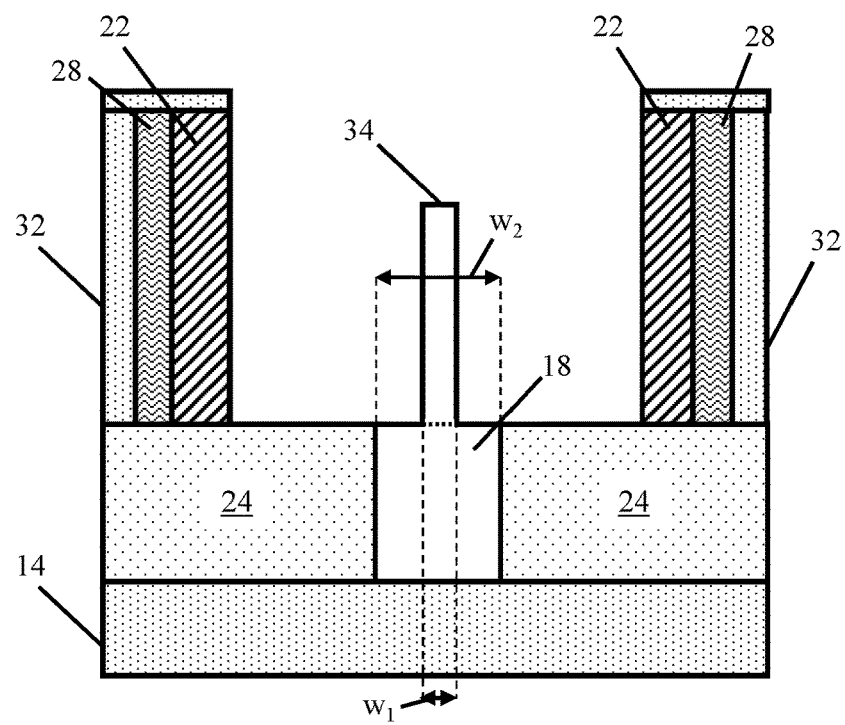

FIG. 10 illustrates an optional process for modifying a channel region of semiconductor fin(s) 18. The exposed portions of semiconductor fin(s) 18 can be partially removed or otherwise reduced in size, whether in the same process in which sacrificial gate 20 is removed or in a different etching process. A channel region 34 can be formed from semiconductor fin(s) 18 as a result of this process, with channel region 34 contacting the remainder of semiconductor fin 18 laterally (i.e., into and out of the plane of the page) and vertically as shown in FIG. 10. Channel region 34 can have a substantially smaller width $w_2$ than a width $w_1$ of the remainder of semiconductor fin 18 from which channel region 34 is formed.

Figure 11:
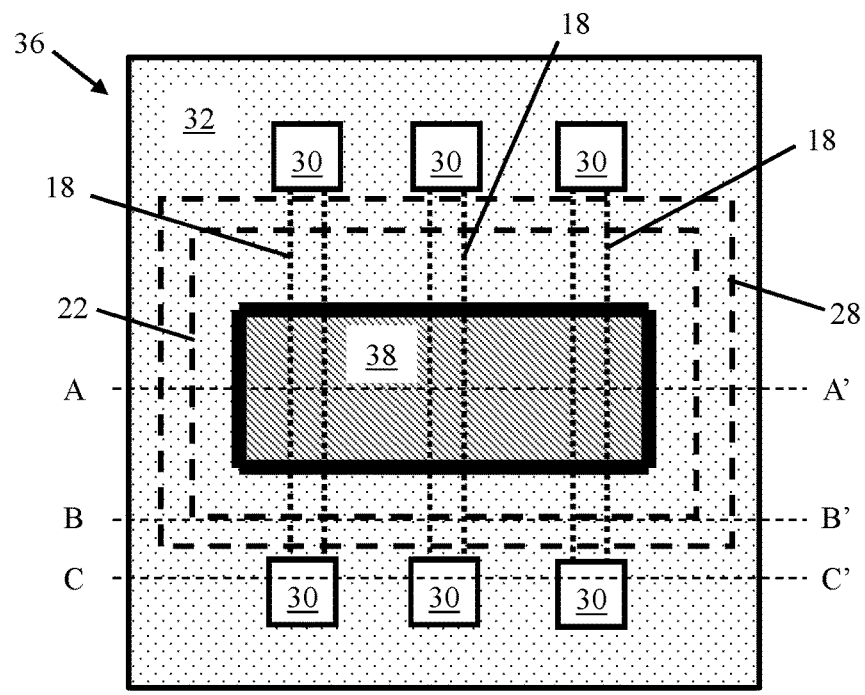
FIG. 11 shows a top-down view of an integrated circuit (IC) structure according to embodiments of the present disclosure.
Figure 12:
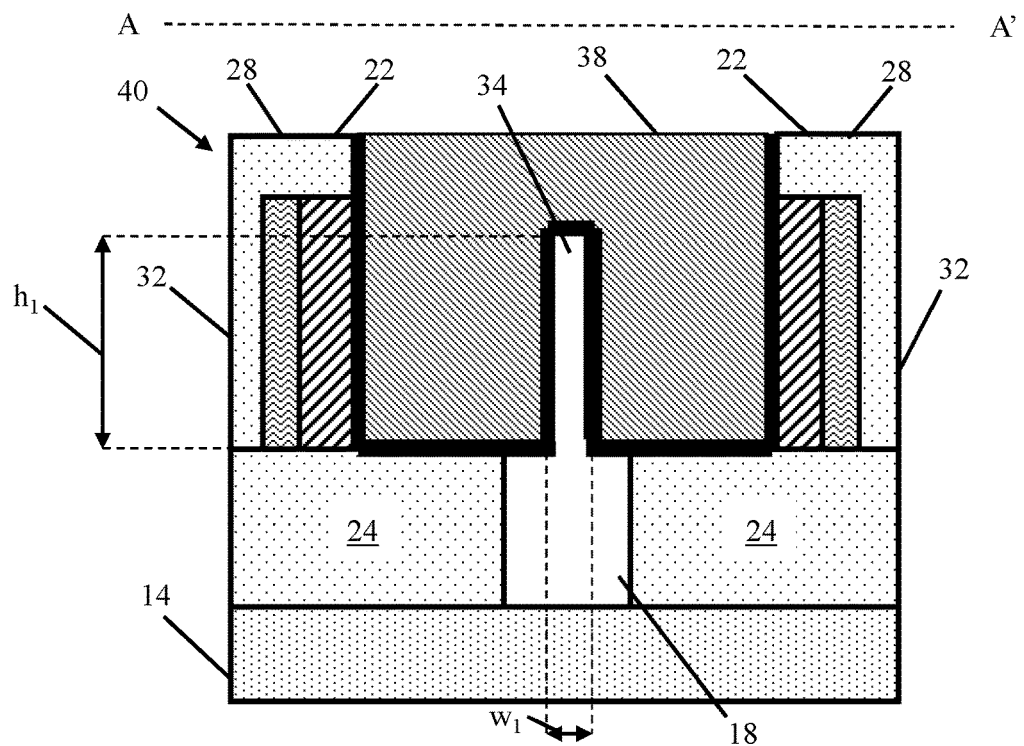
FIGS. 12-14 show cross-sectional views of an IC structure according to embodiments of the present disclosure.

A top-down view of an IC structure 36 is shown in FIG. 11. After sacrificial gate 20 is removed, a gate dielectric 38 can be formed in its place, e.g., by deposition and planarization. Gate dielectric 38 can include one or more dielectric materials and/or other materials. As examples, gate dielectric 38 can include silicon oxide ($SiO_2$), hafnium oxide ($HfO_2$), zirconium silicate ($ZrSiO_4$), and/or other types of dielectric materials. As is shown by example in FIG. 11, IC structure 36 can include multiple semiconductor fins 18 extending through gate dielectric 38 between source/drain contacts 30. To further illustrate the features of IC structure 38, reference lines which correspond to cross-sectional views, A-A' (FIG. 12), B-B' (FIG. 13), and C-C' (FIG. 14), are provided. Semiconductor fins 18, first spacer 22, and second spacer 28 are shown with phantom lines to designate their position beneath dielectric layer 32. First and second spacers 22, 28 can be positioned circumferentially about gate dielectric 38, as shown in FIG. 12. In alternative embodiments, IC structure 36 can include sacrificial gate 20 (FIGS. 3-4, 6-8) instead of gate dielectric 38. For example, IC structure 36 can be fabricated without removing sacrificial gate 20, and sacrificial gate 20 can be replaced with gate dielectric 38 or another component in a separate or independent process where applicable. Where IC structure 36 includes sacrificial gate 20, sacrificial gate 20 can be in the form of polycrystalline silicon or other materials capable of being removed selectively.

IC structure 36 can include at least one semiconductor fin 18, with gate dielectric 38 being positioned above semiconductor fin 18 and defining a first region 40 (FIG. 12) thereof. First and/or second spacers 22, 28 can be positioned above semiconductor fin 18 to thereby define one or more second regions 42 (FIG. 13) thereof. Source/drain contacts 30 can contact and thereby define one or more third regions 44 (FIG. 14) of semiconductor fin 18. Adjacent second 42 and third regions 44 of IC structure 36 can, together, make up one "end region" of IC structure 36. Alternatively, an "end region" of IC structure 36 can include all portions of semiconductor fin(s) 18 which are not located beneath gate dielectric 38 (or sacrificial gate 20 (FIGS. 3-4, 6-8) where applicable). Semiconductor fin(s) 18 can include sloped sidewalls 26 (FIGS. 5-7) at its interface with source/drain contacts 30 at third region 44. Reference line A-A' passes through first region 40 of semiconductor fin(s) 18, reference line B-B' passes through second region 42 of semiconductor fin(s) 18, and reference line C-C' passes through third region 44 of semiconductor fin(s) 18.

Turning to FIG. 12, a cross-sectional view of IC structure 36 (FIG. 11) at first region 40 of one semiconductor fin 18 is provided. Gate dielectric 38 can be positioned about and/or in contact with channel region 34 of semiconductor fin 18. Channel region 34 of semiconductor fin can have a corresponding first height $h_1$ and first width $w_1$. A cross section of the first region of semiconductor fin(s) 18 can include first and second spacers 20, 28 positioned between dielectric layer 32 and gate dielectric 38. In operation, a voltage applied to gate dielectric 38 can influence the electrical conductivity of semiconductor fin 18 through channel region 34.

Figure 13:
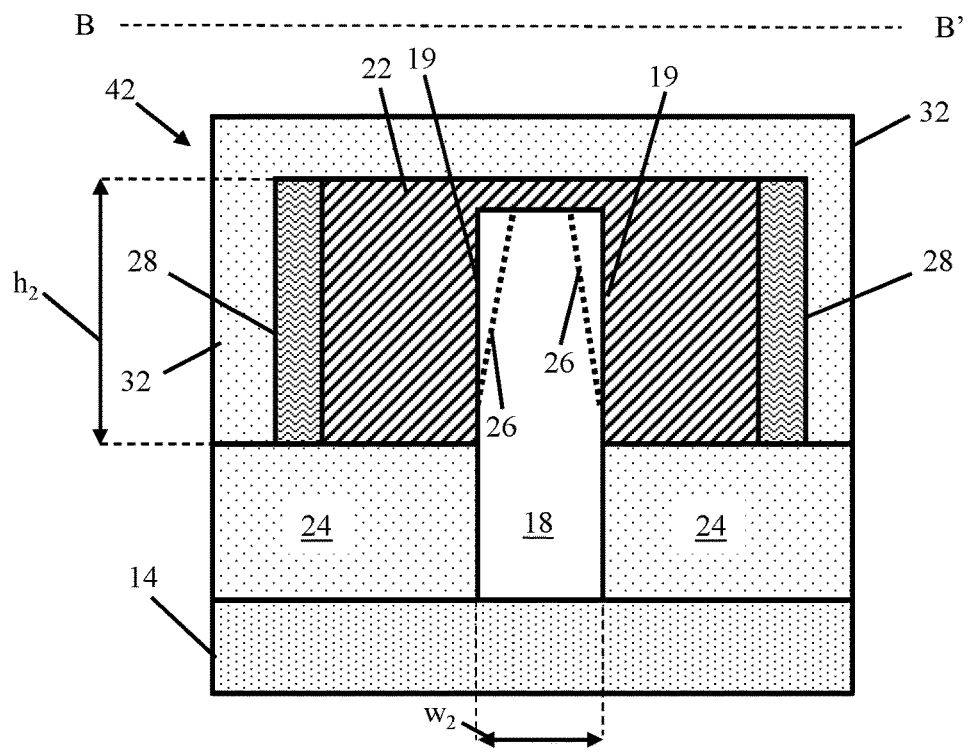

FIG. 13 provides a cross-sectional view along line B-B' of second region 42 of semiconductor fin(s) 18 in IC structure 36 (FIG. 11). Semiconductor fin 18 in second region 42 can extend above dielectric 24 by a particular height $h_2$. Semiconductor fin(s) 18 being positioned between and/or within first and second spacers 22, 28 throughout second region 42 can protect portions of semiconductor fin(s) 18 in first region 40 (FIG. 12), which are shown in FIGS. 9-10 and discussed elsewhere herein. In an embodiment, height $h_2$ can be greater than height $h_1$ (FIG. 12) of first region 40 (FIG. 12). Semiconductor fin(s) 18 within second region 42 can also include a second width $w_2$ in second region 42 which may be larger than first width $w_1$ (FIG. 12) of semiconductor fin(s) within first region 40. As an example, second width $w_2$ of semiconductor fin(s) 18 in second region 42 can be approximately twice the width of $w_1$. In addition, where first and second spacers 22, 28 are formed after the tapering of semiconductor fin(s), semiconductor fin(s) 18 can include sloped sidewalls 26 (shown in phantom) within at least part of second region 42. Sloped sidewalls 26 can be oriented at an angle between approximately seventy degrees and approximately eighty-seven degrees relative to buried insulator layer 14, as is described elsewhere herein and shown by angle α of FIG. 5.

Figure 14:
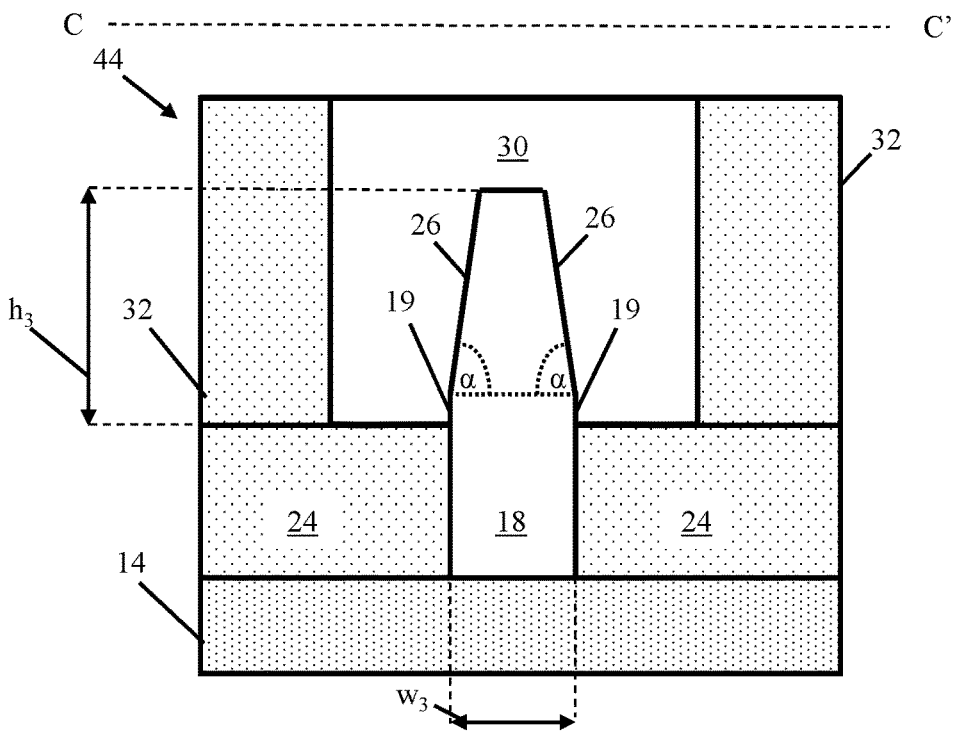

In FIG. 14, a cross-sectional view along line C-C' of third region 44 of semiconductor fin(s) 18 in IC structure 36 (FIG. 11). Semiconductor fin 18 in third region 44 can extend above dielectric 24 by a particular height $h_3$. Semiconductor fin(s) 18 can include sloped sidewalls 26 formed by tapering. IC structure 36 at third region 44 can include one or more source/drain contacts 30 contacting sloped sidewalls 26. Sloped sidewalls 26 of semiconductor fin(s) 18 can provide stability and performance similar to substantially vertical sidewalls 19, while increasing the ability to form source/drain contacts 30 (e.g., by epitaxy) and other elements such as second spacer 28 and/or other electrical components connected to IC structure 36. In an embodiment, height $h_3$ of semiconductor fin(s) 18 in third region 44 can also be greater than height $h_1$ (FIG. 12) of semiconductor fin(s) 18 in first region 40 (FIG. 12). Semiconductor fin(s) 18 within third region 44 can also include a third width $w_3$ which may be larger than first width $w_1$ (FIG. 12) of semiconductor fin(s) within first region 40 (FIG. 12). Third width $w_3$ of semiconductor fin(s) 18 in third region 44 can be approximately twice the width of $w_1$. Sloped sidewalls 26 in third region 44 can be oriented at an angle α with a value between approximately seventy degrees and approximately eighty-seven degrees relative to buried insulator layer 14.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming an integrated circuit (IC) structure, the method comprising:
   forming a sacrificial gate on a semiconductor fin;
   forming a first spacer on the semiconductor fin, the first spacer positioned circumferentially about the sacrificial gate;

forming a second spacer on the semiconductor fin, the second spacer positioned circumferentially about the first spacer; and tapering an exposed portion of the semiconductor fin to form sloped sidewalls thereon, the exposed portion of the semiconductor fin positioned adjacent the sacrificial gate, the first spacer, and the second spacer.

2. The method of claim 1, further comprising forming one of a source contact and a drain contact on the sloped sidewalls of the semiconductor fin after the forming of the second spacer.

3. The method of claim 1, further comprising:
forming a dielectric layer on the sacrificial gate, the first spacer, and the second spacer; and
removing a portion of the dielectric layer to expose the sacrificial gate.

4. The method of claim 3, further comprising:
selectively removing the sacrificial gate from the semiconductor fin; and
forming a gate dielectric on an exposed first region of the semiconductor fin after the removing of the sacrificial gate.

5. The method of claim 4, further comprising reducing a width of the exposed first region of the semiconductor fin before the forming of the gate dielectric.

6. The method of claim 1, wherein the sloped sidewalls are oriented at an angle of between approximately seventy degrees and approximately eighty-seven degrees relative to an insulator layer positioned beneath the IC structure.

7. The method of claim 1, wherein the tapering of the exposed portion of the semiconductor fin occurs before the forming of the first spacer and the second spacer.

8. The method of claim 1, wherein the sacrificial gate comprises a polycrystalline silicon material.

9. The method of claim 1, wherein the semiconductor fin comprises at least one of a plurality of semiconductor fins positioned on an insulator layer.

10. A method of forming an integrated circuit (IC) structure, the method comprising:
forming a sacrificial gate on a semiconductor fin;
forming a first spacer on the semiconductor fin, the first spacer positioned circumferentially about the sacrificial gate;
forming a second spacer on the semiconductor fin, the second spacer positioned circumferentially about the first spacer;
tapering an exposed portion of the semiconductor fin to form sloped sidewalls thereon, the exposed portion of the semiconductor fin positioned adjacent the sacrificial gate, the first spacer, and the second spacer; and forming one of a source contact and a drain contact on the sloped sidewalls of the semiconductor fin.

11. The method of claim 10, further comprising:
forming a dielectric layer on the sacrificial gate, the first spacer, and the second spacer; and
removing a portion of the dielectric layer to expose the sacrificial gate.

12. The method of claim 11, further comprising:
selectively removing the sacrificial gate from the semiconductor fin; and
forming a gate dielectric on an exposed first region of the semiconductor fin after the removing of the sacrificial gate.

13. The method of claim 12, further comprising reducing a width of the exposed first region of the semiconductor fin before the forming of the gate dielectric.

14. The method of claim 10, wherein the sloped sidewalls are oriented at an angle of between approximately seventy degrees and approximately eighty-seven degrees relative to an insulator layer positioned beneath the IC structure.

15. The method of claim 10, wherein the tapering of the exposed portion of the semiconductor fin occurs before the forming of the first spacer and the second spacer.

16. The method of claim 10, wherein the sacrificial gate comprises a polycrystalline silicon material.

17. The method of claim 10, wherein the semiconductor fin comprises at least one of a plurality of semiconductor fins positioned on an insulator layer.

18. The method of claim 10, wherein forming the first spacer includes:
covering a portion of a region of the semiconductor fin, the region of the semiconductor fin including an initial geometry of the semiconductor fin.

19. The method of claim 18, wherein forming the second spacer includes:
covering a remaining portion of the region of the semiconductor fin.

20. The method of claim 10, wherein forming one of the source contact and the drain contact on the sloped sidewalls of the semiconductor fin further includes:
forming the source contact on the sloped sidewalls of the semiconductor fin, the source contact formed outside of the first spacer and the second spacer; and
forming the drain contact on the sloped sidewalls of the semiconductor fin, opposite the source contact, the drain contact formed outside of the first spacer and the second spacer.

* * * * *